(12) United States Patent
Vigoda et al.

(10) Patent No.: US 8,717,818 B1
(45) Date of Patent: May 6, 2014

(54) STORAGE DEVICE ARCHITECTURE

(75) Inventors: Benjamin Vigoda, Winchester, MA (US); David Reynolds, Scarborough, ME (US)

(73) Assignee: Analog Devices, Inc., Norwood, MA (US)

( * ) Notice: Subject to any disclaimer, the term of this patent is extended or adjusted under 35 U.S.C. 154(b) by 173 days.

(21) Appl. No.: 13/292,427

(22) Filed: Nov. 9, 2011

Related U.S. Application Data

(60) Provisional application No. 61/411,908, filed on Nov. 9, 2010.

(51) Int. Cl.
*G11C 11/34* (2006.01)
*G11C 16/04* (2006.01)

(52) U.S. Cl.
USPC ............ 365/185.17; 365/185.03; 365/185.18; 365/185.24

(58) Field of Classification Search
USPC ............... 365/185.03, 185.2, 185.21, 185.05, 365/185.24, 185.17, 185.18
See application file for complete search history.

(56) References Cited

U.S. PATENT DOCUMENTS

| 6,930,922 | B2* | 8/2005 | Mori et al. | 365/185.21 |
| 2009/0251969 | A1* | 10/2009 | Roohparvar et al. | 365/185.18 |
| 2010/0315872 | A1* | 12/2010 | Haines | 365/185.03 |

* cited by examiner

*Primary Examiner* — Son Dinh
*Assistant Examiner* — Hien Nguyen
(74) *Attorney, Agent, or Firm* — Occhiuti & Rohlicek LLP

(57) ABSTRACT

In one aspect, a storage device includes a plurality of storage strings, each comprising a serial interconnection of a plurality of active storage elements, each storage element having a part for maintaining a storage state and a part of modulating a current through the element according to the storage state. The device also includes mapping circuitry for selectively sensing a storage state of a storage element in a storage string by forming current though the storage element that is a non-linear function of the storage state. In some examples, the mapping circuitry comprises reference string of active elements, and the mapping circuitry selectively senses a storage state by forming a difference in currents in the sensed storage string and in the reference string that is a non-linear function of the storage state. In some examples, the active storage elements comprise floating gate transistors.

18 Claims, 6 Drawing Sheets

STORAGE DEVICE ARCHITECTURE

CROSS-REFERENCE TO RELATED APPLICATIONS

This application claims the benefit of U.S. Application No. 61/411,908, filed Nov. 9, 2010. The contents of the foregoing application is incorporated herein by reference.

This application is related to the following applications, but does not claim the benefit of the filing dates of, each of which is incorporated herein by reference:

"STORAGE DEVICES WITH SOFT PROCESSING," U.S. application Ser. No. 12/537,060, filed on Aug. 6, 2009, published as US2010/0220514A1 on Sep. 2, 2010;

"STORAGE DEVICES WITH SOFT PROCESSING," U.S. Provisional Application No. 61/246,845, filed on Sep. 29, 2009;

"STORAGE DEVICES WITH SOFT PROCESSING," U.S. Provisional Application No. 61/246,968, filed on Sep. 29, 2009;

"STORAGE DEVICES WITH SOFT PROCESSING," PCT Application No. PCT/US2010/028826, filed on Mar. 26, 2010, published as WO2010/111589A2 on Sep. 30, 2010;

"ANALOG COMPUTATION USING NUMERICAL REPRESENTATIONS WITH UNCERTAINTY," U.S. application Ser. No. 12/716,155, filed on Mar. 2, 2010;

"SIGNAL MAPPING," U.S. application Ser. No. 12/716,113, filed on Mar. 2, 2010, as US2010/0281089A1 on Nov. 4, 2010;

"BELIEF PROPAGATION PROCESSOR," PCT Application No. PCT/US2010/35956, filed on Mar. 2, 2010, published as WO2010/101944 on Sep. 10, 2010;

"ADAPTIVE PROCESSING STORAGE DEVICE", U.S. Provisional Application No. 61/379,640, filed on Sep. 2, 2010; and "ADAPTIVE PROCESSING STORAGE DEVICE", U.S. Provisional Application No. 61/382,828, filed on Sep. 14, 2010.

BACKGROUND

This invention relates to a storage device architecture.

DESCRIPTION

The incorporated patent applications titled "STORAGE DEVICES WITH SOFT PROCESSING" include descriptions of one or more examples of storage devices in which a controllable and/or configurable mapping circuit is used to convert a stored analog value to a set of probability-based values corresponding to different symbols represented by the analog value. In particular, in a storage device in which each memory cell stores a number of bits in a charge storage device (e.g., capacitor or floating transistor gate) according to a quantity of charge or equivalent voltage, the mapping circuit uses a sensed charge or voltage to produce a set of signals representative to the probability that the originally stored value corresponded to one of a set of prototypical values.

The incorporated patent application titled "SIGNAL MAPPING" includes descriptions of mapping circuits that may be used in data storage applications (see, e.g., Sect. 4.3 "Data Storage Applications") and whose output are analog probabilistic representations of storage symbols or bits of binary representations of symbol index. The probabilistic representations may be, without limitation, probabilities, likelihood ratios, or logarithmic representations of likelihood ratios.

The description below addresses embodiments of storage devices that may include one or more features described in the incorporated applications, as well as specific instances of these and other approaches that provide an overall device architecture.

Figure 1:
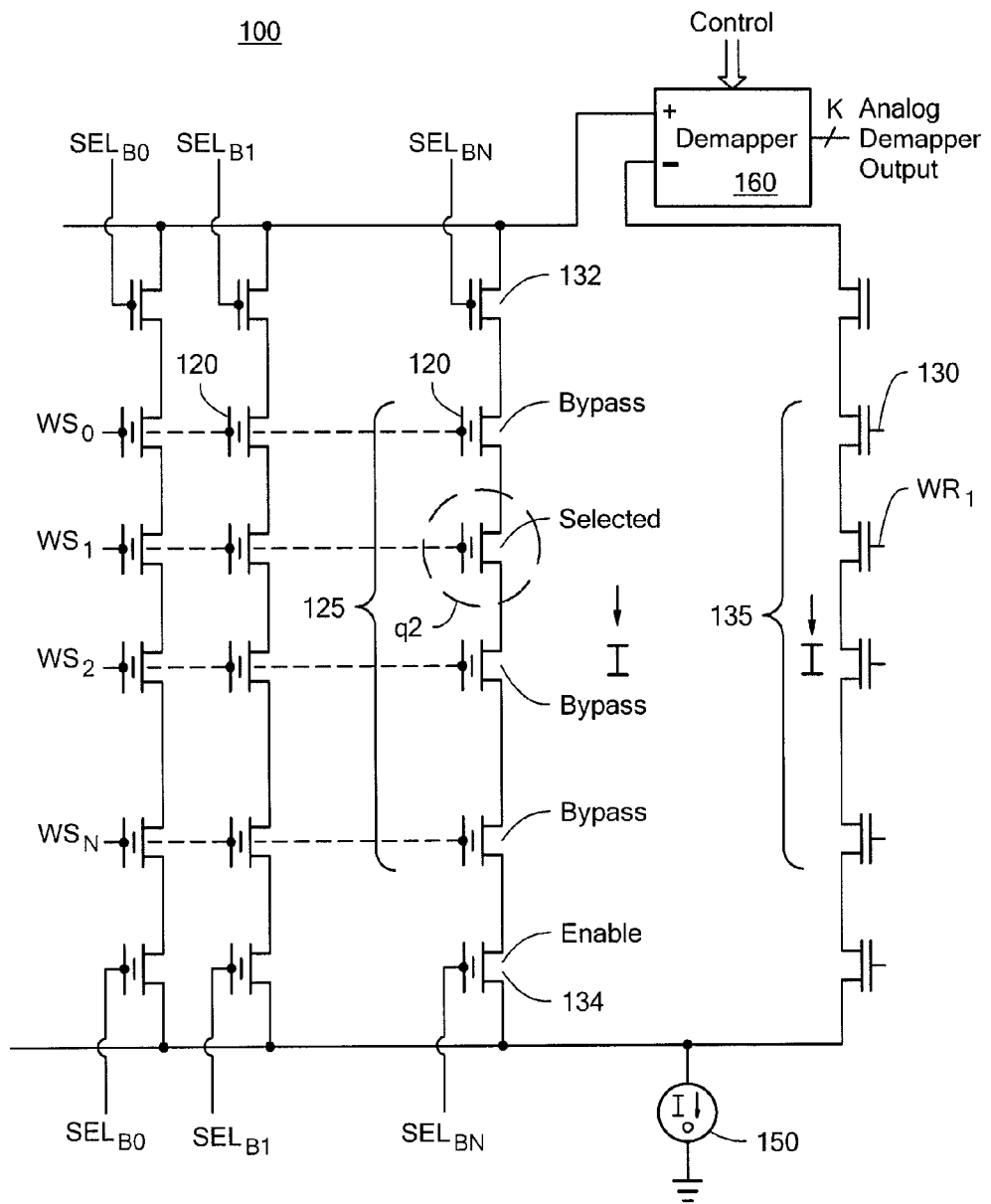
FIG. 1 is a schematic diagram of a portion of a flash memory circuit that includes an analog mapping module.

Referring to FIG. 1, in one embodiment, a flash memory device 100 includes storage circuitry, and circuitry used in the reading values maintained in the storage circuitry. The storage circuitry of the memory device makes use of a "NAND" arrangement of storage transistors 120 each of which stores a values based on a degree of charge that is formed on a floating element of the transistor using conventional writing and erasing techniques. Groups of transistors 120 are arranged in series to form strings 125. For example, a string may have 8 or 32 storage transistors in series. Generally, the memory device includes one or more banks of memory, each of which includes many strings of storage transistors arranges in parallel, for example, with 32 or 64 thousand such strings in parallel.

Reading of the storage state of a storage transistor is accomplished by applying control signals to the gates of the storage transistors in a string such that all but one of the storage transistors have low resistance (i.e., are in a "bypass" state), and the storage transistor being sensed has a resistance that depends on the storage state (i.e., the amount of injected charge on its floating gate). Therefore, for a given voltage potential applied across the string, the resulting current depends on the storage state of the transistor being sensed and is largely independent of the storage state of the other storage transistors in the string.

In an example for sensing the storage state of a selected storage transistor, a separate reference string 135 of transistors 130 is formed in the device, for example, in close proximity to the storage strings. The characteristics of these transistors are matched to the characteristics of the transistors in a storage string. In FIG. 1, a single string 135 is shown, but it should be understood that such strings can be replicated and certain operations that are described as being done in sequentially may be done parallel with such replicated reference strings.

When a particular storage string 125 is to be read, selection transistors 132 and 134 couple the string to reading circuitry. This reading circuitry includes a current source 150, which is coupled to both the selected storage string 125 and to the reference string 135 such that a fixed amount of current passes through the two strings in a proportion that depends on the storage state of the storage transistor being sensed. The reference string is configured according to the gate signals applied to the reference transistors 130 such that certain transistors are bypassed in the same manner as the bypassed storage transistors, and one of the reference transistors is biased at a level corresponding to a certain degree of charge injection of a storage transistor.

Figure 2:
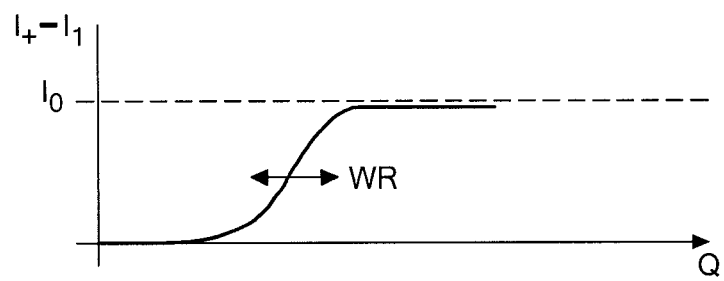
FIG. 2 is a graph of a transfer function from storage state to differential current.

Note that the difference in current flowing in the storage string and in the reference string is an S-shaped function of the charge on the sensed storage transistor, for example, as shown in FIG. 2. The left-to-right offset of the curve in the graph depends on the gate signal applied to the reference transistor that is not bypassed and which corresponds to the sensed storage transistor.

The "SIGNAL MAPPING" application includes circuits with similar functions that provide similar S-shaped input-output characteristics based on stored charge on storage capacitors sensed as voltages on the capacitors. The approach shown in FIG. 1 provides a similar output based on the charge on the storage transistor floating gates without having to represent the stored state as a voltage signal.

Continuing to refer to FIG. 1, a demapper 160 accepts the differential current representation of the storage state and provides an analog output. In an example in which there are only two possible storage states (k=2), the two probabilities of the storage states are provided as outputs of the demapper. In some examples, the demapper applies a logarithmic transformation and provides as output log likelihood ratio signals, which may be suitable for direct application to an analog error correction circuit.

In examples in which more than two storage states are used (e.g., k=4 or 8 storage states), a sequence of control levels may be applied to the gate of the reference transistor 130 and the demapper accumulates the output probability signals, for example, performing a sequential analog computation of parallel circuits shown in the "SIGNAL MAPPING" application.

In some examples, an iteration is applied to read the storage state of corresponding storage transistors in different storage strings, and the demapper accumulates analog quantities (i.e., k values) for each of the strings. In some examples, the iteration involves repeating a cycle over storage strings for each control value of the reference transistor. In some examples, an iteration over different control values is performed for each string.

Note that in some examples in which there are k storage states, rather than providing k output values, log k (base 2) signals are provided with each output value being associated with a different bit of a binary index of the storage state.

Figure 3:
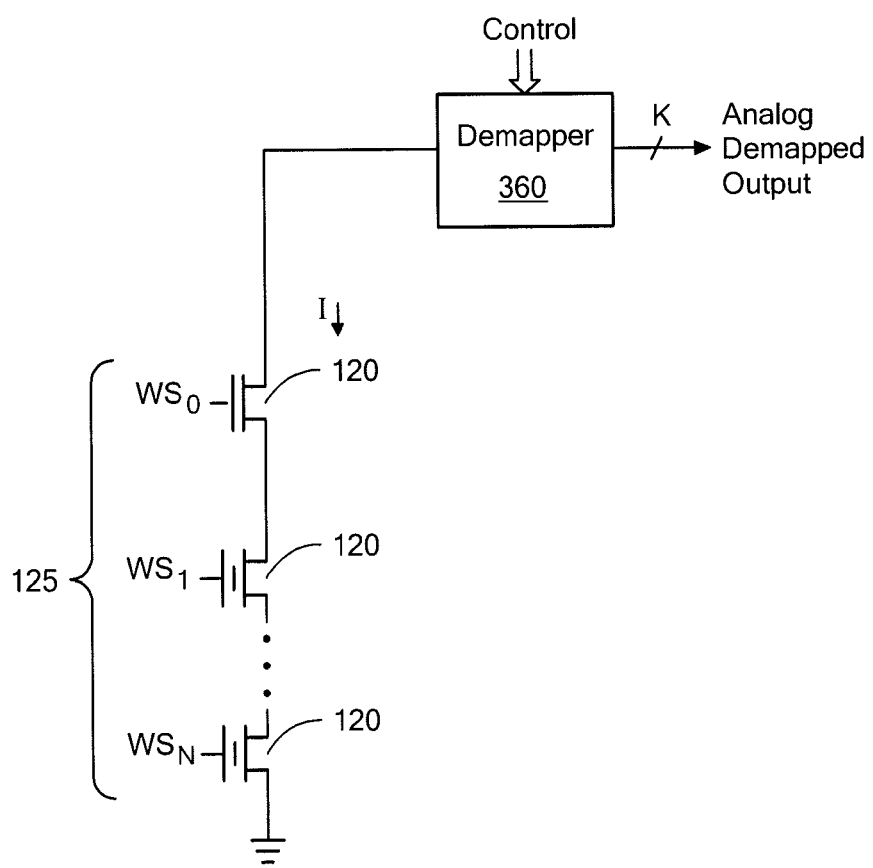
FIG. 3 is a schematic diagram of a portion of a memory circuit.

Referring to FIG. 3, another type of arrangement does not use a reference string, and rather applies a potential across a storage string 125 to sense the storage state of a particular storage transistor 120. The resulting current is sensed by a demapper 360, which outputs k analog values based on the current sensed through the storage string. In some embodiments, the mapping from sensed current to the outputs (e.g., symbol probabilities, log likelihood ratios etc.) depends on a set of control parameters, which may compensate for a variety of factors including which storage transistor is being sensed, the age or cycle count of that transistor, temperature of the device, etc.

Figure 4:
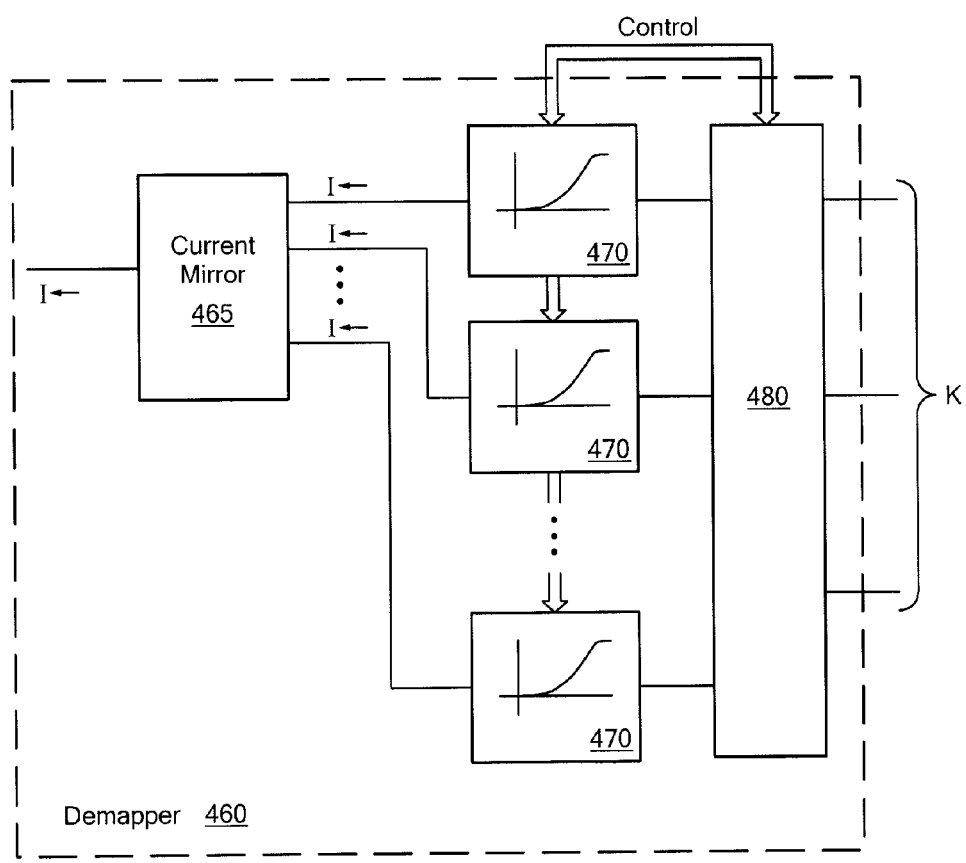
FIG. 4 is an example of a demapper.

Referring to FIG. 4, one implementation of a demapper 460, which corresponds to demapper 360 in FIG. 3, uses a parallel arrangement of circuits that have S-shaped input-output characteristics, for example as described in the "SIGNAL MAPPING" application. The control parameters affect aspects of these mappings, for example, the left-to-right offset and slope of the mappings. In FIG. 4, the circuits 470 accept current input, and a current mirror 465 is used to provide separate current signals to allow the circuits to operate in parallel. In some examples, the outputs of the circuits 470 are combined (e.g., added, subtracted, scaled, subject to logarithmic transformations, etc.) in a combination module 480 to form the output analog signals representing the soft/probabilistic values.

In an alternative to the arrangement in FIG. 4, instead of having a parallel arrangement of transformation elements 470, the transformation are formed in sequence using fewer elements 470, and the outputs are accumulated in analog storage elements within the combination module, or are passed sequentially to downstream processing circuits.

In some arrangements using a demapper of the type shown in FIG. 4, multiple such demappers are embodied in the storage device, in the extreme case with a separate demapper for each string of storage transistors. In intermediate configurations, more than one demapper, but less than the number of storage strings, are using in a scheduled arrangement to sense the state of storage transistors across all the strings of the device or a storage block of the device.

Figure 5:
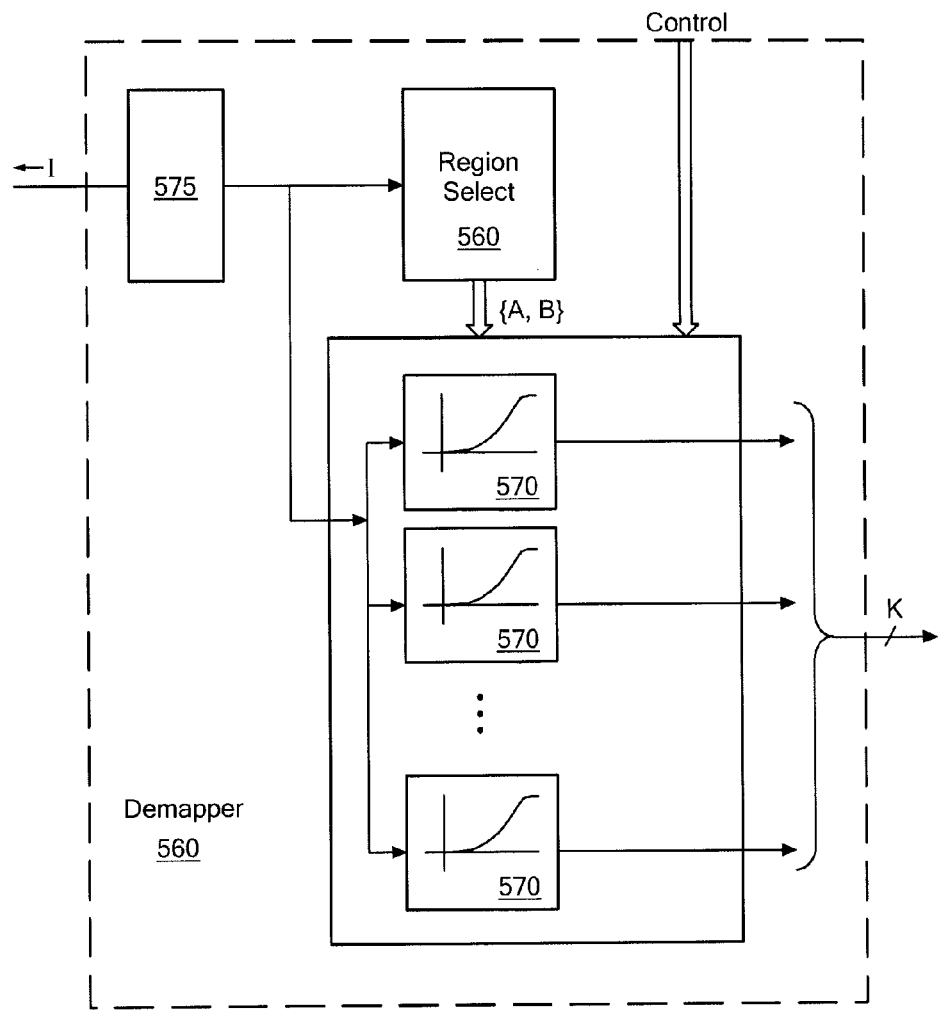
FIG. 5 is an example of a demapper.

Referring to FIG. 5, another implementation of a demapper 560 is used to directly provide log likelihood representations of symbol probabilities. As introduced in the "SIGNAL MAPPING" application, the shape of the functions that map from the sensed value (i.e., the string current) to the log likelihood values are piecewise linear. Therefore, within each of a set of regions of the input domain, the output functions are offset linear functions of the input, with each output having a corresponding offset and slope. For example, referring to FIG. 6, a sample mapping from sensed current to for log likelihood functions 610-613 are piecewise linear, such that in each of a set of regions 620-625, the functions are offset linear functions. Referring back to FIG. 5, in this implementation, the demapper 560 includes a region select module 560, which first determines which region the input is in, and then configures the mapping module 585 with the appropriate offsets and slopes. In this implementation, there are a set of linear mapping elements 570 that are applied in parallel to determine the analog log likelihood outputs. In an alternative similar to an alternative described above, fewer elements 570 are used in succession, for example, to provide a serial sequence of analog outputs.

Figure 6:
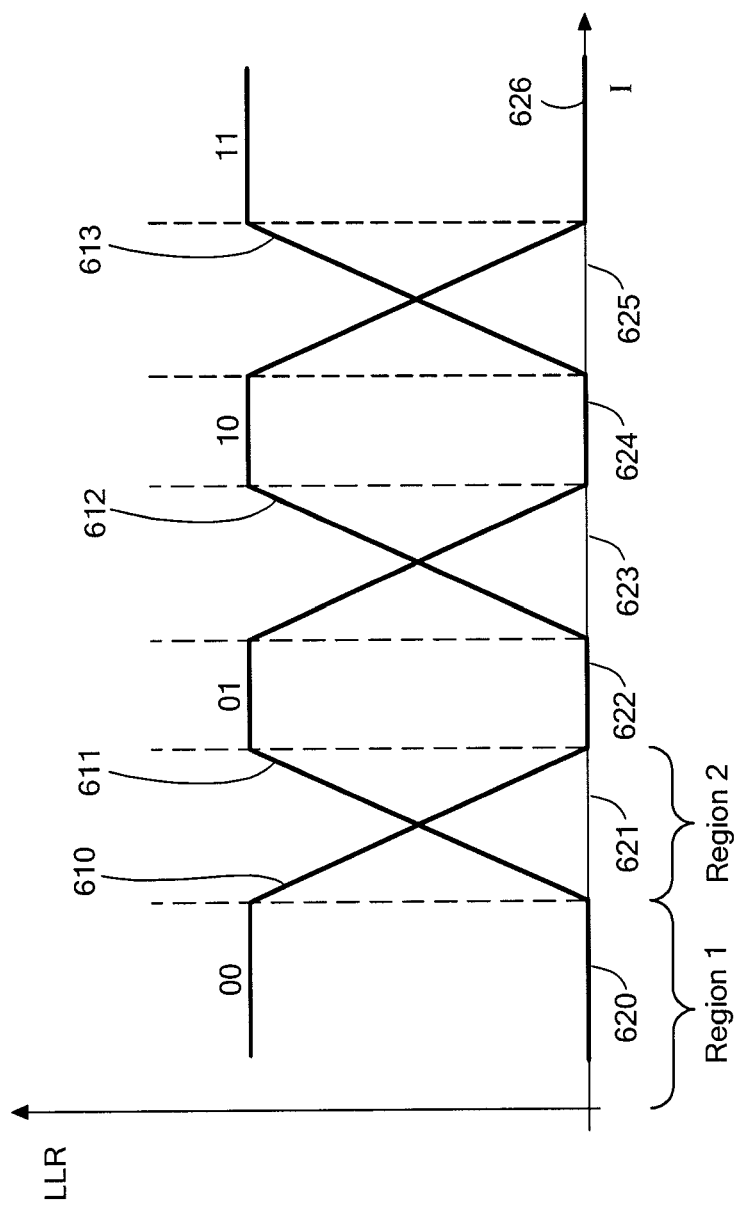
FIG. 6 is a graph of piecewise linear mapping functions.
Figure 7:
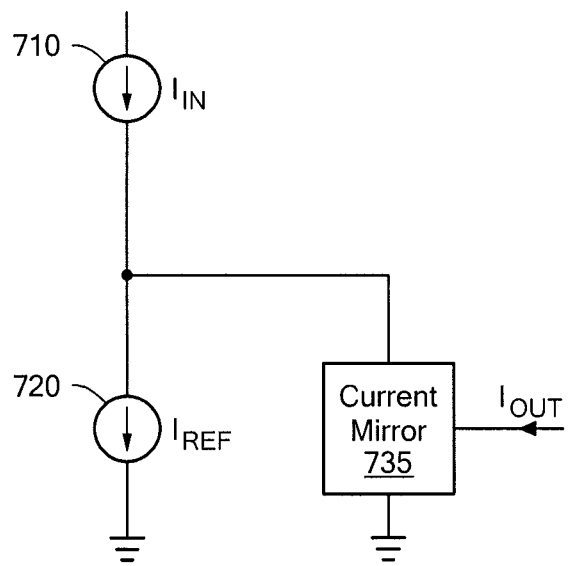
FIG. 7 is a circuit component for a piecewise linear mapping function.
Figure 8:
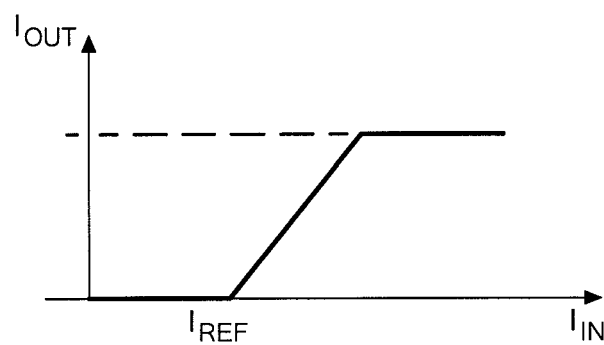
FIG. 8 is a graph of a piecewise linear mapping function.

Referring to FIG. 7, another approach to forming a demapper based on piecewise linear functions (e.g., as shown in FIG. 6) makes use of a current-generator based circuit. In input current source 710 (e.g., formed using a current mirror of a current through a storage string) is coupled to a reference current source 720, such that the difference in the currents is passed to a current mirror circuit 730. This current mirror provides the output current, which in a central region is linear, and that cannot fall below zero or go above a maximum level. An example mapping function is shown in FIG. 8. A combination of multiple of such circuit configurations form the needed piecewise linear functions, for example, the functions shown in FIG. 6. Using such combination, each of the desired piecewise linear mapping functions is formed without a need for identifying a region of the input as in the embodiment of FIG. 5.

The "STORAGE DEVICES WITH SOFT PROCESSING" applications describe various configurations in which the analog probabilistic representations of the storage values are processed, for example, to reduce the error rate using error correction approaches. The approaches described above can be introduced into such configurations. Similarly, the techniques described above can with used with elements described in each of the incorporated applications. In some examples in which a serial signal interface is used between the sensing and demapping circuitry and the error correction circuitry (which may or may not be integrated on the same device/wafer), sequential use of demapping elements may be used when decoding a values across a range of storage strings. In some examples in which analog decoding logic in implemented within the storage device, parallel instances of demappers are used to load multiple bit positions of the input of the decoder in parallel. In some alternative embodiments the demapper circuit is replaced with a simple linear (or nonlinear amplifier). The amplified analog signal is sent off of the flash die to an analog or digital demapper on a separate die or is serialized on the flash die and streamed through an analog or digital demapper on the flash die.

A number of alternative embodiments follow the general approach described above. For instance, the architecture shown with the strings of storage transistors follow a general NAND flash architecture. An approach in which the storage transistors are used in sensing circuits in the manner of FIG. 1 can also be applied to NOR flash architectures. In particular, the non-linear transistor characteristics of the storage transistors can be used in forming desired non-linear mappings from storage state to soft/probabilistic output values.

It should be understood that the examples shown above are only representative. For example, in FIG. 1, the current source 150 and the demapper 160 could be interchanged. Also, the circuits shown store values in single-ended form. In alternative embodiments, pairs of storage cells (e.g., in parallel strings) store symbol values in differential form. In one such arrangement rather than splitting current between a storage string and a reference string, a current source draws current through two strings to form a sigmoid mapping from the difference in injected charge to the difference in current in each of the strings.

It is to be understood that the foregoing description is intended to illustrate and not to limit the scope of the invention.

What is claimed is:

1. A storage device comprising:
   plurality of storage strings, each comprising a serial interconnection of a plurality of active storage elements, each storage element having a part for maintaining a storage state and a part of modulating a current through the element according to the storage state; and
   mapping circuitry for selectively sensing a storage state of a storage element in a storage string by forming current though the storage element that is a non-linear function of the storage state;
   wherein the mapping circuitry comprises a reference string of active elements, and the mapping circuitry selectively senses a storage state by forming a difference in currents in the sensed storage string and in the reference string that is a non-linear function of the storage state.

2. The storage device of claim 1 wherein the active storage elements comprise floating gate transistors.

3. The storage device of claim 1 wherein the storage state comprises a degree of charge present in the storage element.

4. The storage device of claim 1 wherein the storage strings comprise strings of floating gate transistors in a NAND flash storage device.

5. The storage device of claim 1 wherein the mapping circuitry comprises one or more controllable sigmoid generators each having a control input for affecting a slope and an offset of an input to output mapping of the sigmoid generator, wherein each of the sigmoid generators is configured to received a current signal representing the current formed through the storage string, and to provide a corresponding output dependent on the storage state and the control input to the sigmoid generator.

6. The storage device of claim 5 wherein the mapping circuit further comprises a combination module configured to combine multiple outputs of the one or more sigmoid generators to form an output representative of the storage state.

7. The storage device of claim 6 wherein the combination module is configure to form an output representative of probabilities of k possible storage states.

8. The storage device of claim 7 wherein k is greater than 2.

9. The storage device of claim 5 wherein the one or more sigmoid generators comprises more than one sigmoid generator configured to operate in parallel to provide multiple different outputs dependent on the storage state.

10. The storage device of claim 5 wherein the one or more sigmoid generators comprises at least one sigmoid generator configure to operate sequentially with different control inputs in processing the current signal representing the current formed through the storage string to provide multiple different outputs dependent on the storage state.

11. A storage device comprising:
    plurality of storage strings, each comprising a serial interconnection of a plurality of active storage elements, each storage element having a part for maintaining a storage state and a part of modulating a current through the element according to the storage state; and
    mapping circuitry for selectively sensing a storage state of a storage element in a storage string by forming current though the storage string that is a non-linear function of the storage state;
    wherein the mapping circuitry comprises one or more controllable sigmoid generators each having a control input for affecting a slope and an offset of an input to output mapping of the sigmoid generator, wherein each of the sigmoid generators is configured to received a current signal representing the current formed through the storage string, and to provide a corresponding output dependent on the storage state and the control input to the sigmoid generator.

12. The storage device of claim 11 wherein the mapping circuitry comprises reference string of active elements, and the mapping circuitry selectively senses a storage state by forming a difference in currents in the sensed storage string and in the reference string that is a non-linear function of the storage state.

13. The storage device of claim 11 wherein the mapping circuit further comprises a combination module configured to combine multiple outputs of the one or more sigmoid generators to form an output representative of the storage state.

14. The storage device of claim 13 wherein the combination module is configure to form an output representative of probabilities of k possible storage states.

15. The storage device of claim 14 wherein k is greater than 2.

16. The storage device of claim 11 wherein the one or more sigmoid generators comprises more than one sigmoid generator configured to operate in parallel to provide multiple different outputs dependent on the storage state.

17. The storage device of claim 11 wherein the one or more sigmoid generators comprises at least one sigmoid generator configure to operate sequentially with different control inputs in processing the current signal representing the current formed through the storage string to provide multiple different outputs dependent on the storage state.

18. A storage device comprising:
    plurality of storage strings, each comprising a serial interconnection of a plurality of active storage elements, each storage element having a part for maintaining a storage state and a part of modulating a current through the element according to the storage state; and mapping circuitry for selectively sensing a storage state of a storage element in a storage string by forming current though the storage string that is a non-linear function of the storage state;

wherein the mapping circuitry comprises one or more sigmoid generators each configured to received a current signal representing the current formed through the storage string, and to provide a corresponding output dependent on the storage state and the control input to the sigmoid generator; and wherein the mapping circuitry further comprises a combination module configured to combine multiple outputs of the one or more sigmoid generators to form an output representative of the storage state.

* * * * *